(12) United States Patent
Oh et al.

(10) Patent No.: US 8,120,980 B2
(45) Date of Patent: Feb. 21, 2012

(54) SEMICONDUCTOR MEMORY DEVICE IN WHICH A METHOD OF CONTROLLING A BIT LINE SENSE AMPLIFIER IS IMPROVED

(75) Inventors: Chi-Sung Oh, Gunpo-si (KR); Jung-Bae Lee, Yongin-si (KR); Dong-Hyuk Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 221 days.

(21) Appl. No.: 12/686,561

(22) Filed: Jan. 13, 2010

(65) Prior Publication Data

US 2010/0177576 A1 Jul. 15, 2010

(30) Foreign Application Priority Data

Jan. 14, 2009 (KR) ........................ 10-2009-0003046

(51) Int. Cl.
*G11C 7/02* (2006.01)
(52) U.S. Cl. ........................ 365/207; 364/214
(58) Field of Classification Search .................. 365/207, 365/214
See application file for complete search history.

(56) References Cited

U.S. PATENT DOCUMENTS

| | | |
|---|---|---|
| 5,638,333 A | 6/1997 | Lee |
| 7,800,970 B2 * | 9/2010 | Hong et al. ............ 365/208 |
| 2005/0052931 A1 | 3/2005 | Hardee |
| 2009/0010086 A1 * | 1/2009 | Hong et al. ............ 365/207 |
| 2009/0109778 A1 * | 4/2009 | Terzioglu et al. ......... 365/205 |

FOREIGN PATENT DOCUMENTS

| | | |
|---|---|---|
| JP | 08-055476 | 2/1996 |
| JP | 2005-085454 | 3/2005 |
| KR | 100122108 | 9/1997 |
| KR | 1020040006380 | 1/2004 |

* cited by examiner

*Primary Examiner* — Tuan T. Nguyen (74) *Attorney, Agent, or Firm* — F. Chau & Associates, LLC (57) ABSTRACT

A semiconductor memory device includes a sense amplifier, a sense amplifier driving signal driver, and a controller. The sense amplifier is configured to sense and amplify a signal of a bit line and a signal of a complementary bit line in response to a sense amplifier driving signal. The sense amplifier driving signal driver includes a first driving signal driver configured to drive via a transmission line the sense amplifier driving signal in response to a first sense amplifier control signal, and a second driving signal driver configured to drive via the transmission line the sense amplifier driving signal in response to a second sense amplifier control signal. The controller activates the first sense amplifier control signal in response to an active command, and toggles the second sense amplifier control signal while the first sense amplifier control signal is activated.

20 Claims, 3 Drawing Sheets

SEMICONDUCTOR MEMORY DEVICE IN WHICH A METHOD OF CONTROLLING A BIT LINE SENSE AMPLIFIER IS IMPROVED

CROSS-REFERENCE TO RELATED APPLICATION

This application claims priority under 35 U.S.C. §119 to Korean Patent Application No. 10-2009-0003046, filed on Jan. 14, 2009, the disclosure of which is incorporated by reference herein in its entirety.

BACKGROUND

1. Technical Field

The inventive concept relates to a semiconductor memory device, and more particularly, to a semiconductor memory device in which a method of controlling a bit line sense amplifier that senses and amplifies data stored in a memory cell is improved.

2. Discussion of Related Art

Semiconductor memory devices (e.g., dynamic random access memories (DRAMs)) are generally arranged in an array of memory cells. Each column of the array is composed of a bit line and a complementary bit line (hereinafter referred to as a bit line pair) with each bit line connected to every other memory cell in the column, for example. To read data stored in a memory cell, a small voltage difference generated between a bit line pair, which is caused by a charge shared between the bit line receiving the data and a capacitor of the memory cell, is sensed and amplified to produce a binary logic signal. A bit line sense amplifier is used for sensing and amplifying the small voltage difference generated between the bit line pair. The bit line sense amplifier also writes back the data read from the memory cell.

Bit line sense amplifiers affect both memory access time and overall power dissipation. Bit line leakage current, however, can adversely affect the bit line sense amplifier sensing speed during read operations. Accordingly, there exists a need to reduce bit line leakage current.

SUMMARY

An exemplary embodiment of the inventive concept provides a semiconductor memory device including a sense amplifier configured to reduce leakage current of a bit line when operated.

An exemplary embodiment of the inventive concept provides a semiconductor memory device that includes a sense amplifier, a sense amplifier driving signal driver, and a controller. The sense amplifier is configured to sense and amplify a signal of a bit line and a signal of a complementary bit line in response to a sense amplifier driving signal. The sense amplifier driving signal driver includes a first driving signal driver configured to drive via a transmission line the sense amplifier driving signal in response to a first sense amplifier control signal, and a second driving signal driver configured to drive via the transmission line the sense amplifier driving signal in response to a second sense amplifier control signal. The controller activates the first sense amplifier control signal in response to an active command, which may be an external command, and toggles the second sense amplifier control signal while the first sense amplifier control signal is activated. The second driving signal driver has a larger driving capability than the first driving signal driver.

In an exemplary embodiment of the inventive concept, the controller may activate the first sense amplifier control signal in response to the active command, and deactivate the first sense amplifier control signal in response to a precharge command.

In an exemplary embodiment of the inventive concept, the controller may activate the second sense amplifier control signal for a first time after a predetermined delay time has lapsed, when the first sense amplifier control signals are activated in response to the active command.

In an exemplary embodiment of the inventive concept, the controller may activate the second sense amplifier control signal for a first time in response to a read or write command.

In an exemplary embodiment of the inventive concept, the controller may activate the second sense amplifier control signal in response to a read or write command, and deactivates the second sense amplifier control signal after a burst operation is terminated.

In an exemplary embodiment of the inventive concept, the controller may activate the second sense amplifier control signal for a first time in response to the precharge command.

In an exemplary embodiment of the inventive concept, the sense amplifier driving signal may include a PMOS sense amplifier driving signal. The sense amplifier may include: a PMOS sense amplifier configured to sense a low level signal of the bit line or the complementary bit line, and amplify the signal of the bit line or the complementary bit line sensed with the low level to a power supply voltage level in response to the PMOS sense amplifier driving signal.

In an exemplary embodiment of the inventive concept, the first sense amplifier control signal may include a first PMOS sense amplifier control signal, and the second sense amplifier control signal may include a second PMOS sense amplifier control signal. The first driving signal driver may include a first PMOS driving signal driver configured to drive via a first transmission line the PMOS sense amplifier driving signal in response to the first PMOS sense amplifier control signal. The second driving signal driver may include a second PMOS driving signal driver configured to drive via the first transmission line the PMOS sense amplifier driving signal in response to the second PMOS sense amplifier control signal.

In an exemplary embodiment of the inventive concept, each of the first and second PMOS driving signal drivers may include a PMOS transistor, which is connected between a power supply voltage and the first transmission line, to which the first and second PMOS sense amplifier control signals are applied, respectively.

In an exemplary embodiment of the inventive concept, the sense amplifier driving signal may include an NMOS sense amplifier driving signal. The sense amplifier may include: an NMOS sense amplifier configured to sense a low level signal of the bit line or the complementary bit line, and amplify the signal of the bit line or the complementary bit line sensed with the high level to a ground voltage level in response to the NMOS sense amplifier driving signal.

In an exemplary embodiment of the inventive concept, the first sense amplifier control signal may include a first NMOS sense amplifier control signal, and the second sense amplifier control signal may include a second NMOS sense amplifier control signal. The first driving signal driver may include a first NMOS driving signal driver configured to drive via a second transmission line the NMOS sense amplifier driving signal in response to the first NMOS sense amplifier control signal. The second driving signal driver may include a second NMOS driving signal driver configured to drive via the second transmission line the NMOS sense amplifier driving signal in response to the second NMOS sense amplifier control signal.

In an exemplary embodiment of the inventive concept, each of the first and second NMOS driving signal drivers may include an NMOS transistor, which is connected between a ground voltage and the second transmission line, to which the first and second NMOS sense amplifier control signals are applied, respectively.

In an exemplary embodiment of the inventive concept, a semiconductor memory device, includes: a sense amplifier including a PMOS sense amplifier and an NMOS sense amplifier connected to a bit line and a complementary bit line; a PMOS sense amplifier driving signal driver outputting a PMOS sense amplifier driving signal to the PMOS sense amplifier in response to first and second PMOS sense amplifier control signals to cause the PMOS sense amplifier to sense a voltage difference between the bit line and the complementary bit line and amplify the voltage difference until one of the bit lines has a high voltage level; an NMOS driving signal driver outputting an NMOS sense amplifier driving signal to the NMOS sense amplifier in response to first and second NMOS sense amplifier control signals to cause the NMOS sense amplifier to sense a voltage difference between the bit line and the complementary bit line and amplify the voltage difference until one of the bit lines has a low voltage level; and a controller activating and deactivating the second PMOS and NMOS sense amplifier control signals while the first PMOS and NMOS sense amplifier control signals are activated.

The second PMOS and NMOS sense amplifier control signals may be activated in response to an active command, read command, write command or precharge command.

The active command, read command, write command or precharge command may be applied from a device separate from the semiconductor memory device.

The PMOS driving signal driver may include first and second PMOS transistors to which the first and second PMOS sense amplifier control signals are applied, respectively, and the NMOS driving signal driver may include first and second NMOS transistors to which the first and second NMOS sense amplifier control signals are applied, respectively, the second PMOS transistor having a larger current driving capability than the first PMOS transistor and the second NMOS transistor having a larger current driving capability than the first NMOS transistor.

In an exemplary embodiment of the inventive concept, a semiconductor memory device operating method, includes: outputting, from a controller to a sense amplifier driving signal driver, a first sense amplifier control signal for a first predetermined time; in response to a command, outputting from the controller to the sense amplifier driving signal driver, a second sense amplifier control signal for part of the first predetermined time; in response to the first and second sense amplifier control signals, outputting from the sense amplifier driving signal driver a sense amplifier driving signal; and receiving, at a sense amplifier, the sense amplifier driving signal and in response thereto sensing and amplifying a signal of a bit line and a signal of a complementary bit line to which the sense amplifier is connected.

In an exemplary embodiment of the inventive concept, the outputting the sense amplifier driving signal may output the sense amplifier driving signal with a larger driving capability during the part of the first predetermined time than a rest of the first predetermined time.

In an exemplary embodiment of the inventive concept, the first sense amplifier control signal may include a first PMOS sense amplifier control signal and a first NMOS sense amplifier control signal. The second sense amplifier control signal may include a second PMOS sense amplifier control signal and a second NMOS sense amplifier control signal. The sense amplifier driving signal may include a PMOS sense amplifier driving signal and an NMOS sense amplifier driving signal. The sense amplifier driving signal driver may include a PMOS sense amplifier driving signal driver outputting the PMOS sense amplifier driving signal in response to the first and second PMOS sense amplifier control signals and an NMOS sense amplifier driving signal driver outputting the NMOS sense amplifier driving signal in response to the first and second NMOS sense amplifier control signals, The command may include an active command, read command, write command or precharge command.

BRIEF DESCRIPTION OF THE DRAWINGS

The above and other features of the inventive concept will become more apparent by describing in detail exemplary embodiments thereof with reference to the accompanying drawings.

DETAILED DESCRIPTION OF THE EMBODIMENTS

Exemplary embodiments of the inventive concept will now be described more fully with reference to the accompanying drawings.

The inventive concept may, however, be embodied in many alternate forms and should not be construed as limited to only the exemplary embodiments set forth herein.

It will be understood that when an element is referred to as being "connected" or "coupled" to another element, it can be directly connected or coupled to the other element or intervening elements may be present.

Hereinafter, a semiconductor memory device according to an exemplary embodiment of the inventive concept will be described with reference to the accompanying drawings.

Figure 1:
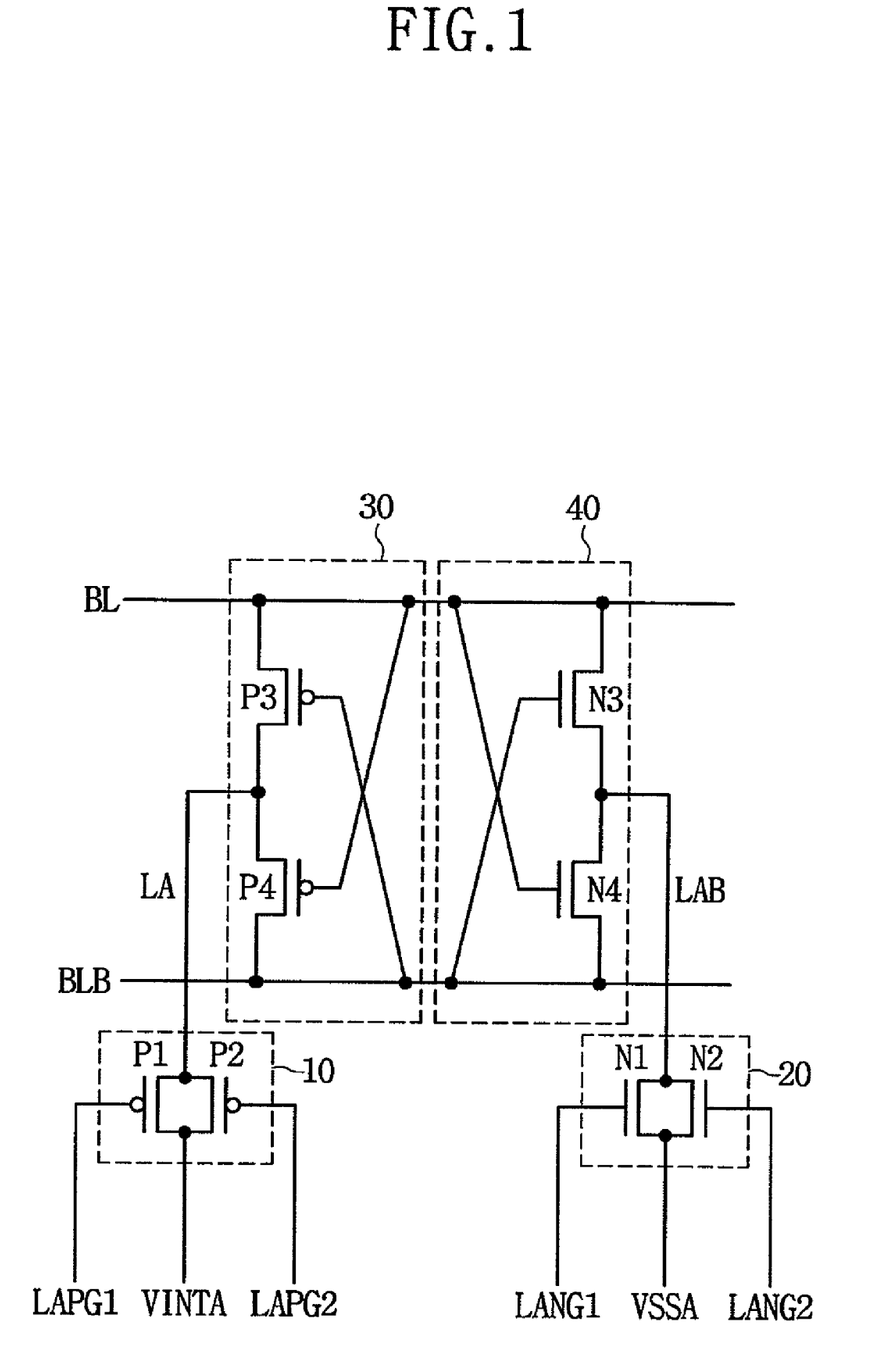
FIG. 1 illustrates a sense amplifier and a sense amplifier driving signal driver of a semiconductor memory device according to an exemplary embodiment of the inventive concept.

FIG. 1 is a circuit diagram of a sense amplifier and a sense amplifier driving signal driver of a semiconductor memory device according to an exemplary embodiment of the inventive concept.

Referring to FIG. 1, the semiconductor memory device includes a PMOS sense amplifier driving signal driver 10, an NMOS sense amplifier driving signal driver 20, a PMOS sense amplifier 30, and an NMOS sense amplifier 40. Referring to FIG. 1, reference character "BL" denotes a bit line, "BLB" denotes a complementary bit line, "LAPG1" denotes a first PMOS sense amplifier control signal, "LAPG2" denotes a second PMOS sense amplifier control signal, "LANG1" denotes a first NMOS sense amplifier control signal, "LANG2" denotes a second NMOS sense amplifier control signal, "LA" denotes a PMOS sense amplifier driving signal, "LAB" denotes an NMOS sense amplifier driving signal, "VINTA" denotes a power supply voltage, and "VSSA" denotes a ground voltage ("VINTA" and "VSSA" can also be an internal power supply voltage and an internal ground voltage, respectively). A plurality of memory cells are connected between a word line (not shown) and a bit line BL and a complementary bit line BLB (hereinafter, referred to as a bit line pair BL/BLB). The word line may be disposed perpendicular to the bit line pair BL/BLB.

The function of the semiconductor memory device of FIG. 1 will now be described in detail.

The driving signal drivers 10 and 20 activate a signal line outputting the driving signals LA and LAB in response to the control signals LAPG1, LAPG2, LANG1 and LANG2.

The PMOS sense amplifier driving signal driver 10 activates a signal line transferring the PMOS sense amplifier driving signal LA in response to the first PMOS sense amplifier control signal LAPG1 and the second PMOS sense amplifier control signal LAPG2. In other words, the PMOS sense amplifier driving signal driver 10 may be configured to output the PMOS sense amplifier driving signal LA which has the level of the power supply voltage VINTA in response to the first PMOS sense amplifier control signal LAPG1 and the second PMOS sense amplifier control signal LAPG2.

The PMOS sense amplifier driving signal driver 10 may include a first PMOS driving signal driver P1 and a second PMOS driving signal driver P2, which are connected between the power supply voltage VINTA and the signal line transferring the PMOS sense amplifier driving signal LA. In addition, the second PMOS driving signal driver P2 may be configured to have a larger driving capability than the first PMOS driving signal driver P1. The first PMOS driving signal driver P1 is activated for a predetermined period of time until a precharge command is applied after an active command is applied, and the second PMOS driving signal driver P2 is activated for a part of the predetermined period of time in response to the active command, a read (or write) command and/or the precharge command. Therefore, the PMOS sense amplifier driving signal driver 10 may have a larger driving capability while the second PMOS driving signal driver P2 is activated than while the second PMOS driving signal driver P2 is deactivated.

As shown in FIG. 1, the first PMOS driving signal driver P1 and the second PMOS driving signal driver P2 may include PMOS transistors, respectively. In this case, the PMOS transistor of the second PMOS driving signal driver P2 may be designed to have a larger width than the PMOS transistor of the first PMOS driving signal driver P1. In addition, the PMOS transistor of the second PMOS driving signal driver P2 may be designed to have a smaller gate oxide thickness than the PMOS transistor of the first PMOS driving signal driver P1.

Similarly, the NMOS sense amplifier driving signal driver 20 may activate a signal line transferring the NMOS sense amplifier driving signal LAB in response to the first NMOS sense amplifier control signal LANG1 and the second NMOS sense amplifier control signal LANG2. In other words, the NMOS sense amplifier driving signal driver 20 may be configured to output the NMOS sense amplifier driving signal LAB which has the level of the ground voltage VSSA in response to the first NMOS sense amplifier control signal LANG1 and the second NMOS sense amplifier control signal LANG2.

In addition, the NMOS sense amplifier driving signal driver 20 may include a first NMOS driving signal driver N1 and a second NMOS driving signal driver N2, which are connected between the ground voltage VSSA and the signal line that transfers the NMOS sense amplifier driving signal LAB. Moreover, the second NMOS driving signal driver N2 may be configured to have a lager driving capability than the first NMOS driving signal driver N1. The first NMOS driving signal driver N1 is activated for a predetermined period of time until a precharge command is applied after an active command is applied, and the second NMOS driving signal driver N2 is activated for a part of the predetermined period of time in response to the active command, a read (or write) command and/or the precharge command. Therefore, the NMOS sense amplifier driving signal driver 20 may have a larger driving capability while the second NMOS driving signal driver N2 is activated than while the second NMOS driving signal driver N2 is deactivated.

As shown in FIG. 1, the first NMOS driving signal driver N1 and the second NMOS driving signal driver N2 may include NMOS transistors, respectively. In this case, the NMOS transistor of the second NMOS driving signal driver N2 may be designed to have a larger width than the NMOS transistor of the first NMOS driving signal driver N1. In addition, the NMOS transistor of the second NMOS driving signal driver N2 may be designed to have a smaller gate oxide thickness than the NMOS transistor of the first NMOS driving signal driver N1.

A sense amplifier having the PMOS sense amplifier 30 and the NMOS sense amplifier 40 senses and amplifies a voltage difference between the bit line pair BL and BLB in response to the PMOS sense amplifier driving signal LA and the NMOS sense amplifier driving signal LAB.

The PMOS sense amplifier 30 senses a voltage difference between the bit line pair BL and BLB, and amplifies the voltage of the bit line pair BL or BLB to a high voltage level, e.g., the level of the power supply voltage VINTA, in response to the PMOS sense amplifier driving signal LA that has the level of the power supply voltage VINTA.

The NMOS sense amplifier 40 senses a voltage difference between the bit line pair BL and BLB, and amplifies the voltage of the bit line pair BL or BLB to a low voltage level, e.g., the level of the ground voltage VSSA, in response to the NMOS sense amplifier driving signal LAB that has the level of the ground voltage VINTA.

Figure 2:
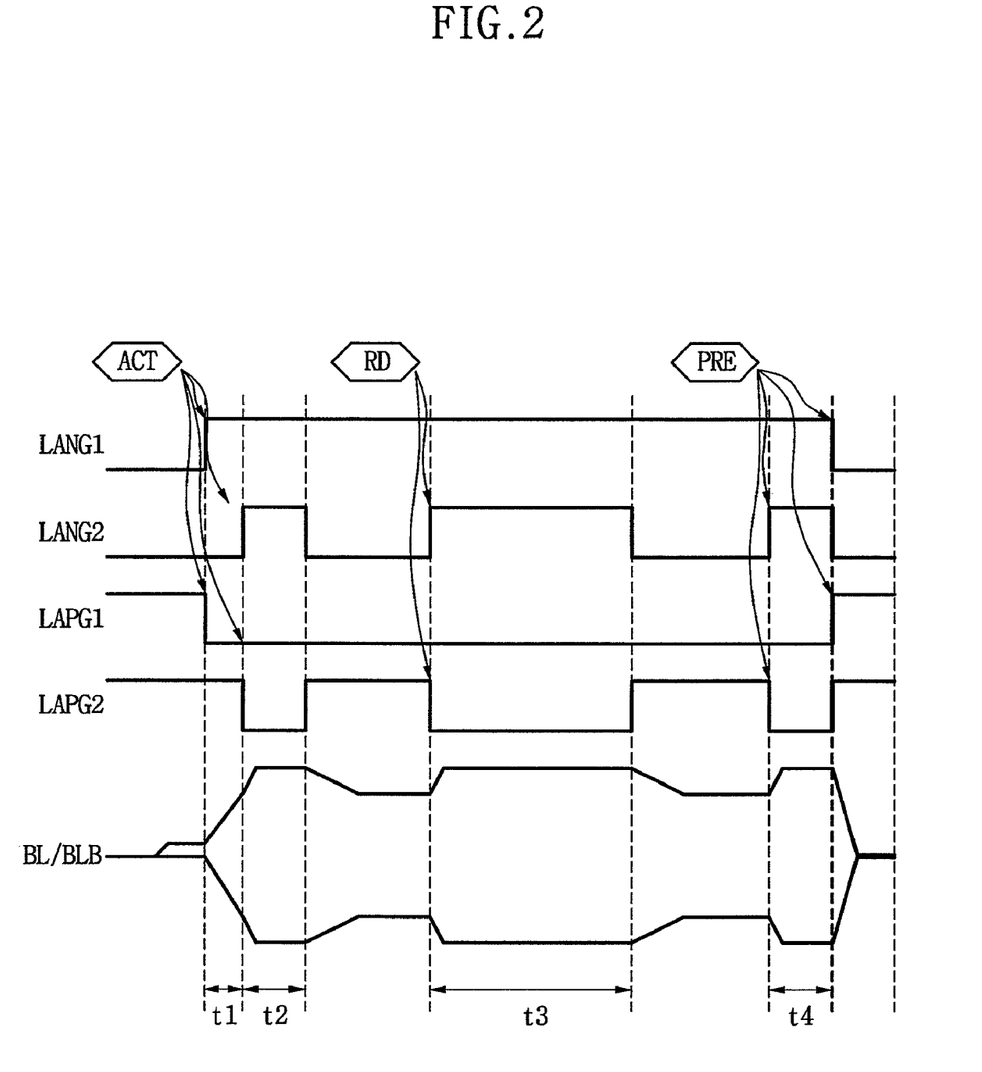
FIG. 2 is a timing diagram illustrating an example operation of the sense amplifier and the sense amplifier driving signal driver of FIG. 1.

FIG. 2 is a timing diagram illustrating an operation of the sense amplifier and the sense amplifier driving signal driver of FIG. 1 according to an exemplary embodiment of the inventive concept.

Referring to FIG. 2, reference character "ACT" denotes an active command, "RD" denotes a read command, "PRE" denotes a precharge command, "BL/BLB" denotes a bit line and a complementary bit line, "LAPG1" denotes a first PMOS sense amplifier control signal, "LAPG2" denotes a second PMOS sense amplifier control signal, "LANG1" denotes a first NMOS sense amplifier control signal, and "LANG2" denotes a second NMOS sense amplifier control signal.

Operations of the sense amplifier of the semiconductor memory device according to an exemplary embodiment of the inventive concept will now be described in detail with reference to FIG. 2.

The first PMOS sense amplifier control signal LAPG1 is activated to a low level in response to the active command ACT, and is deactivated to a high level in response to the precharge command PRE. In addition, the first NMOS sense amplifier control signal LANG1 is activated to a high level in response to the active command ACT, and is deactivated to a low level in response to the precharge command PRE.

In other words, when the active command ACT is applied, the first PMOS sense amplifier control signal LAPG1 and the first NMOS sense amplifier control signal LANG1 are activated to a low level and a high level, respectively, after a predetermined time that is required for charge sharing between a memory cell and the bit line pair BL and BLB. When the precharge command PRE is applied, the first PMOS sense amplifier control signal LAPG1 and the first NMOS sense amplifier control signal LANG1 are deactivated to a high level and a low level, respectively, after a predetermined time that is required for restoring data in the memory cell.

The second PMOS sense amplifier control signal LAPG2 is activated to a low level for a predetermined period of time in response to the active command ACT, activated to a low level for a predetermined period of time in response to the read command RD, and activated to a low level for a predetermined period of time in response to the precharge command PRE. The predetermined periods of time may be different or the same. In addition, the second NMOS sense amplifier control signal LANG2 is activated to a high level for a predetermined period of time in response to the active command ACT, activated to a high level for a predetermined period of time in response to the read command RD, and activated to a high level for a predetermined period of time in response to the precharge command PRE. The predetermined periods of time may be different or the same.

In other words, the second PMOS sense amplifier control signal LAPG2 and the second NMOS sense amplifier control signal LANG2 are activated to a low level and a high level, respectively, for a predetermined time t2 sufficient to amplify a voltage difference between the bit line pair BL and BLB after a predetermined time that is required for charge sharing between a memory cell and the bit line pair BL and BLB. For example, the second PMOS sense amplifier control signal LAPG2 and the second NMOS sense amplifier control signal LANG2 may be activated, when a predetermined time t1 lapses after the first PMOS sense amplifier control signal LAPG1 and the first NMOS sense amplifier control signal LANG1 are activated in response to the active command ACT to reduce the effect of noise that can be generated by a bit line, for example, during a sensing operation.

In addition, the second PMOS sense amplifier control signal LAPG2 and the second NMOS sense amplifier control signal LANG2 may be activated to a low level and a high level, respectively, for a predetermined time t3 that is required to read data from the memory cell, when the read command RD is applied. Here, the second PMOS sense amplifier control signal LAPG2 and the second NMOS sense amplifier control signal LANG2 are activated in response to the read command RD, and may be deactivated when a burst operation is completed in response to a burst control signal (not shown).

Furthermore, the second PMOS sense amplifier control signal LAPG2 and the second NMOS sense amplifier control signal LANG2 may be activated to a low level and a high level, respectively, for a predetermined time t4 that is required to restore data in the memory cell, when the precharge command PRE is applied.

In other words, in the sense amplifier and the sense amplifier driving signal driver of a semiconductor memory device according to an exemplary embodiment of the inventive concept, as shown in FIG. 2, operations of the first PMOS driving signal driver P1 and the first NMOS driving signal driver N1 are different from those of the second PMOS driving signal driver P2 and the second NMOS driving signal driver N2.

For example, the first PMOS driving signal driver P1 and the first NMOS driving signal driver N1 are activated when the first PMOS sense amplifier control signal LAPG1 and the first NMOS sense amplifier control signal LANG1 are activated in response to the active command ACT. The first PMOS sense amplifier control signal LAPG1 and the first NMOS sense amplifier control signal LANG1 are maintained in an active state until a predetermined time lapses after the precharge command PRE is applied. Accordingly, the first PMOS driving signal driver P1 and the first NMOS driving signal driver N1 remain activated until a predetermined time lapses after the precharge command PRE is applied.

When the active command ACT is applied, the first PMOS sense amplifier control signal LAPG1 and the first NMOS sense amplifier control signal LANG1 are activated, and the predetermined time t1 lapses, the second PMOS sense amplifier control signal LAPG2 and the second NMOS sense amplifier control signal LANG2 are activated for the predetermined time t2, so that the second PMOS driving signal driver P2 and the second NMOS driving signal driver N2 are activated. In addition, the second PMOS sense amplifier control signal LAPG2 and the second NMOS sense amplifier control signal LANG2 are deactivated after the predetermined time t2 lapses. Accordingly, the second PMOS driving signal driver P2 and the second NMOS driving signal driver N2 are not activated.

Afterwards, when the read command RD is applied, the second PMOS sense amplifier control signal LAPG2 and the second NMOS sense amplifier control signal LANG2 are activated for the predetermined time t3, and thus the second PMOS driving signal driver P2 and the second NMOS driving signal driver N2 are activated. The second PMOS sense amplifier control signal LAPG2 and the second NMOS sense amplifier control signal LANG2 are deactivated after the predetermined time t3 lapses. Accordingly, the second PMOS driving signal driver P2 and the second NMOS driving signal driver N2 are not activated. As described above, the predetermined time t3 may be determined by a burst length. In detail, the second PMOS sense amplifier control signal LAPG2 and the second NMOS sense amplifier control signal LANG2 may be configured to be activated in response to the read command RD, and to be deactivated when the burst operation is completed.

Afterwards, when the precharge command PRE is applied, the second PMOS sense amplifier control signal LAPG2 and the second NMOS sense amplifier control signal LANG2 are activated for the predetermined time t4, and thus the second PMOS driving signal driver P2 and the second NMOS driving signal driver N2 are activated. All the first and second PMOS sense amplifier control signals LAPG1 and LAPG2 and the first and second NMOS sense amplifier control signals LANG1 and LANG2 are deactivated after the predetermined time t4 lapses. Accordingly, the first and second PMOS driving signal drivers P1 and P2 and the first and second NMOS driving signal drivers N1 and N2 are not activated.

In FIG. 2, a case in which the second PMOS sense amplifier control signal LAPG2 and the second NMOS sense amplifier control signal LANG2 are activated for the predetermined time t3 when the read command RD is applied, has been described. On the other hand, the second PMOS sense amplifier control signal LAPG2 and the second NMOS sense amplifier control signal LANG2 may be configured to be activated for the predetermined time t3 when the write command is applied. In this case, the second PMOS driving signal driver P2 and the second NMOS driving signal driver N2 are activated for the predetermined time t3 when the write command is applied.

Figure 3:
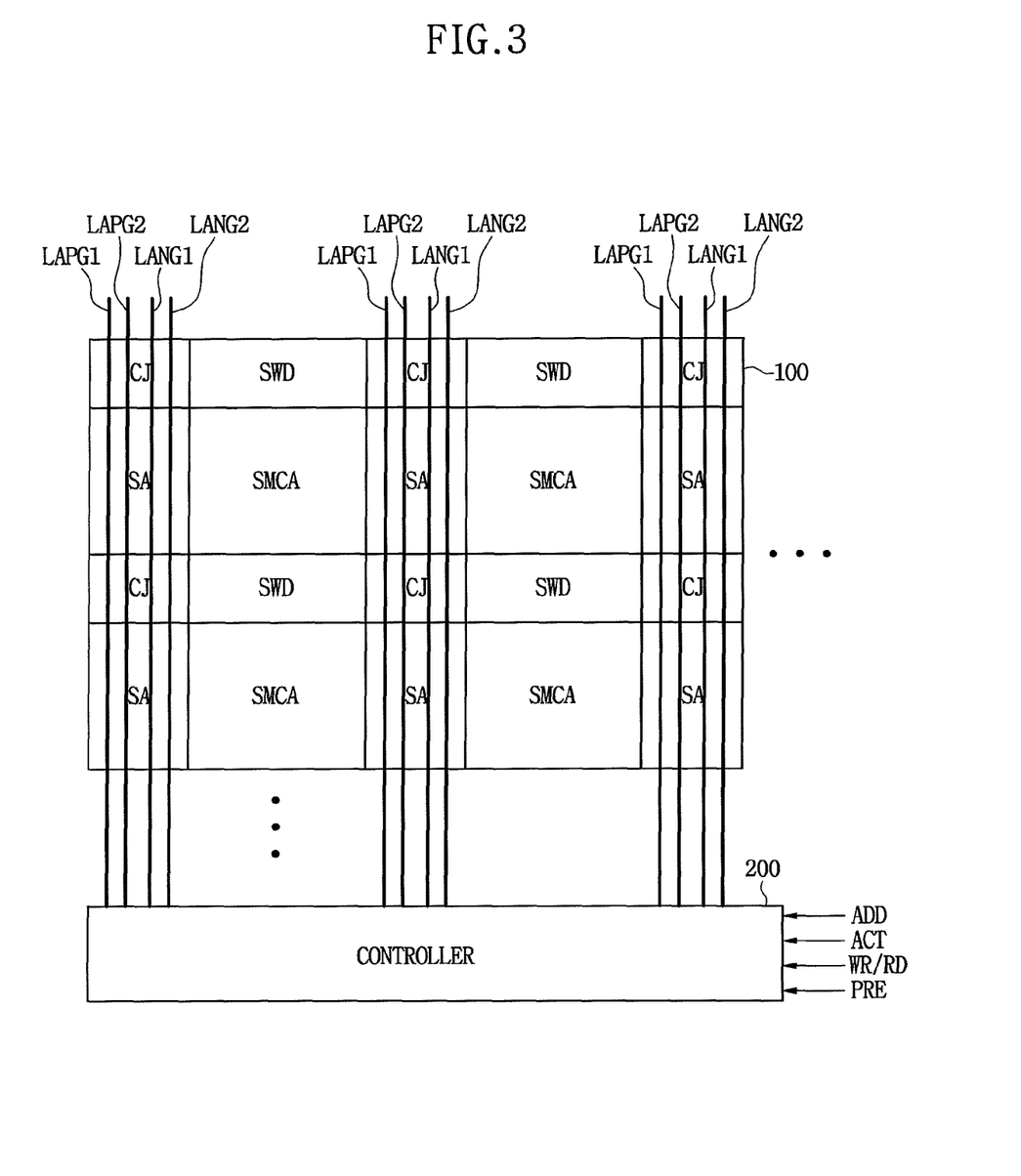
FIG. 3 illustrates a semiconductor memory device according to an exemplary embodiment of the inventive concept.

FIG. 3 illustrates a semiconductor memory device according to an exemplary embodiment of the inventive concept. As shown in FIG. 3, the semiconductor memory device includes a memory cell array 100 and a controller 200. The memory cell array 100 includes a conjunction area CJ, a sensing area SA, a sub word line driver area SWD and a sub memory cell array area SMCA.

In the memory cell array 100 of the semiconductor memory device, blocks which each have the conjunction area CJ, the sub word line driver area SWD, the sensing area SA, and the sub memory cell array area SMCA, are arranged repeatedly in row and column directions. In addition, a bit line precharge circuit (not shown) and a sense amplifier (not shown) including an NMOS sense amplifier and a PMOS sense amplifier are disposed in the sensing area SA, and sub word line drivers (not shown) are disposed in the sub word line driver area SWD. Moreover, a control signal generation circuit (not shown) configured to control the sub word line drivers, and a driving signal driver (not shown) configured to control the bit line precharge circuit and the sense amplifier, are disposed in the conjunction area CJ.

The functions of each block of FIG. 3 will now be described in detail.

The sub memory cell array area SMCA of the memory cell array 100 includes a plurality of memory cells (not shown) disposed between word lines (not shown) and bit lines (not shown). The bit lines are arranged perpendicular to the direction of the word lines, and data is written to and read from a selected memory cell.

The sub word line driver area SWD of the memory cell array 100 is disposed at a side in the direction of the word line of the sub memory cell array area SMCA, and a sub word line driver of the sub word line driver area SWD is configured to activate a selected word line by mixing an output signal of the control signal generation circuit which is disposed in the conjunction area CJ, and a signal transferred to a main word line (not shown) from the controller 200.

The sensing area SA is disposed at a side in the direction of the bit line of the sub memory cell array area SMCA, and the bit line precharge circuit in the sensing area SA precharges a bit line, and the sense amplifier in the sensing area SA senses and amplifies the data of the bit line.

The conjunction area CJ is disposed in an intersection of the sub word line driver area SWD and the sensing area SA, and the driving signal driver of the conjunction area CJ activates a driving signal line for driving the bit line precharge circuit and the sense amplifier in response to a control signal output from the controller 200.

For example, the PMOS sense amplifier driving signal driver 10 and the NMOS sense amplifier driving signal driver 20 of FIG. 1 may be disposed in the conjunction area CJ, and the PMOS sense amplifier 30 and NMOS sense amplifier 40 may be disposed in the sensing area SA. In this case, the PMOS sense amplifier driving signal driver 10 that is disposed in the conjunction area CJ, may be configured to activate a signal line that transfers the PMOS sense amplifier driving signal LA in response to the first and second PMOS sense amplifier control signals LAPG1 and LAPG2, and the NMOS sense amplifier driving signal driver 20 that is disposed in the conjunction area CJ may be configured to activate a signal line that transfers the NMOS sense amplifier driving signal LAB in response to the first and second NMOS sense amplifier control signals LANG1 and LANG2.

The controller 200 may be configured to output the first and second PMOS sense amplifier control signals LAPG1 and LAPG2, and the first and second NMOS sense amplifier control signals LANG1 and LANG2 similarly to that shown in the timing diagram of FIG. 2, in response to the external commands, such as the active command ACT, the write/read command WR/RD, and the precharge command PRE. In this case, the controller 200 may be configured to activate only a selected control signal among the first and second PMOS sense amplifier control signals LAPG1 and LAPG2, and the first and second NMOS sense amplifier control signals LANG1 and LANG2 similarly to that shown in the timing diagram of FIG. 2, by decoding external address signals ADD.

In other words, the controller 200 may be configured to activate the first PMOS sense amplifier control signal LAPG1 and the first NMOS sense amplifier control signal LANG1 in response to the external active command ACT, and may be configured to output the second PMOS sense amplifier control signal LAPG2 and the second NMOS sense amplifier control signal LANG2 that toggle as shown in FIG. 2, while the first PMOS sense amplifier control signal LAPG1 and the first NMOS sense amplifier control signal LANG1 are activated. Accordingly, the controller 200 controls the operation of the PMOS sense amplifier driving signal driver 10 and the NMOS sense amplifier driving signal driver 20, and thus controls the operation of the sense amplifiers 30 and 40 by the first and second PMOS sense amplifier control signals LAPG1 and LAPG2, and the first and second NMOS sense amplifier control signals LANG1 and LANG2 as shown in FIG. 2.

Although not shown, the controller 200 may be configured to output a control signal for driving the bit line precharge circuit of the sensing area SA in response to the precharge command PRE, and may control the sub word line driver of the sub word line driver area SWD, which selects and activates a word line, by the activation of a main word line.

A semiconductor memory device according to an exemplary embodiment of the inventive concept includes a sense amplifier driving signal driver having two driving signal drivers, one having a larger driving capability than the other, wherein the semiconductor memory device operates the driving signal driver with the larger driving capability only for a predetermined period of time, to thereby reduce leakage current that can be generated in a bit line when a sense amplifier operates.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A semiconductor memory device, comprising:
   a sense amplifier configured to sense and amplify a signal of a bit line and a signal of a complementary bit line in response to a sense amplifier driving signal;
   a sense amplifier driving signal driver including a first driving signal driver configured to drive via a transmission line the sense amplifier driving signal in response to a first sense amplifier control signal, and a second driving signal driver configured to drive via the transmission line the sense amplifier driving signal in response to a second sense amplifier control signal; and
   a controller configured to activate the first sense amplifier control signal in response to an active command, and toggle the second sense amplifier control signal while the first sense amplifier control signal is activated.

2. The semiconductor memory device according to claim 1, wherein the second driving signal driver has a larger driving capability than the first driving signal driver.

3. The semiconductor memory device according to claim 1, wherein the controller activates the first sense amplifier control signal in response to the active command, and deactivates the first sense amplifier control signal in response to a precharge command.

4. The semiconductor memory device according to claim 3, wherein the controller activates the second sense amplifier control signal for a first time after a predetermined delay time has lapsed, when the first sense amplifier control signals are activated in response to the active command.

5. The semiconductor memory device according to claim 3, wherein the controller activates the second sense amplifier control signal for a first time in response to a read or write command.

6. The semiconductor memory device according to claim 3, wherein the controller activates the second sense amplifier control signal in response to a read or write command, and deactivates the second sense amplifier control signal after a burst operation is terminated.

7. The semiconductor memory device according to claim 3, wherein the controller activates the second sense amplifier control signal for a first time in response to the precharge command.

8. The semiconductor memory device according to claim 1, wherein the sense amplifier driving signal includes a PMOS sense amplifier driving signal, and the sense amplifier includes:
a PMOS sense amplifier configured to sense a low level signal of the bit line or the complementary bit line and amplify the signal of the bit line or the complementary bit line sensed with the low level to a power supply voltage level in response to the PMOS sense amplifier driving signal.

9. The semiconductor memory device according to claim 8, wherein the first sense amplifier control signal includes a first PMOS sense amplifier control signal, and the second sense amplifier control signal includes a second PMOS sense amplifier control signal; and
wherein the first driving signal driver includes a first PMOS driving signal driver configured to drive via a first transmission line the PMOS sense amplifier driving signal in response to the first PMOS sense amplifier control signal, and the second driving signal driver includes a second PMOS driving signal driver configured to drive via the first transmission line the PMOS sense amplifier driving signal in response to the second PMOS sense amplifier control signal.

10. The semiconductor memory device according to claim 9, wherein each of the first and second PMOS driving signal drivers includes a PMOS transistor, which is connected between a power supply voltage and the first transmission line, to which the first and second PMOS sense amplifier control signals are applied, respectively.

11. The semiconductor memory device according to claim 1, wherein the sense amplifier driving signal includes a NMOS sense amplifier driving signal, and the sense amplifier includes:
an NMOS sense amplifier configured to sense a high level signal of the bit line or the complementary bit line and amplify the signal of the bit line or the complementary bit line sensed with the high level to a ground voltage level in response to the NMOS sense amplifier driving signal.

12. The semiconductor memory device according to claim 11, wherein the first sense amplifier control signal includes a first NMOS sense amplifier control signal, and the second sense amplifier control signal includes a second NMOS sense amplifier control signal; and
wherein the first driving signal driver includes a first NMOS driving signal driver configured to drive via a second transmission line the NMOS sense amplifier driving signal in response to the first NMOS sense amplifier control signal, and the second driving signal driver includes a second NMOS driving signal driver configured to drive via the second transmission line the NMOS sense amplifier driving signal in response to the second NMOS sense amplifier control signal.

13. The semiconductor memory device according to claim 12, wherein each of the first and second NMOS driving signal drivers includes an NMOS transistor, which is connected between a ground voltage and the second transmission line, to which the first and second NMOS sense amplifier control signals are applied, respectively.

14. A semiconductor memory device, comprising:
a sense amplifier including a PMOS sense amplifier and an NMOS sense amplifier connected to a bit line and a complementary bit line;
a PMOS sense amplifier driving signal driver outputting a PMOS sense amplifier driving signal to the PMOS sense amplifier in response to first and second PMOS sense amplifier control signals to cause the PMOS sense amplifier to sense a voltage difference between the bit line and the complementary bit line and amplify the voltage difference until one of the bit lines has a high voltage level;
an NMOS driving signal driver outputting an NMOS sense amplifier driving signal to the NMOS sense amplifier in response to first and second NMOS sense amplifier control signals to cause the NMOS sense amplifier to sense a voltage difference between the bit line and the complementary bit line and amplify the voltage difference until one of the bit lines has a low voltage level; and
a controller activating and deactivating the second PMOS and NMOS sense amplifier control signals while the first PMOS and NMOS sense amplifier control signals are activated.

15. The semiconductor memory device according to claim 14, wherein the second PMOS and NMOS sense amplifier control signals are activated in response to an active command, read command, write command or precharge command.

16. The semiconductor memory device according to claim 14, wherein the PMOS driving signal driver includes first and second PMOS transistors to which the first and second PMOS sense amplifier control signals are applied, respectively, and the NMOS driving signal driver includes first and second NMOS transistors to which the first and second NMOS sense amplifier control signals are applied, respectively, wherein the second PMOS transistor has a larger current driving capability than the first PMOS transistor and wherein the second NMOS transistor has a larger current driving capability than the first NMOS transistor.

17. A semiconductor memory device operating method, comprising:
outputting, from a controller to a sense amplifier driving signal driver, a first sense amplifier control signal for a first predetermined time;
in response to a command, outputting from the controller to the sense amplifier driving signal driver, a second sense amplifier control signal for part of the first predetermined time;
in response to the first and second sense amplifier control signals, outputting from the sense amplifier driving signal driver a sense amplifier driving signal; and
receiving, at a sense amplifier, the sense amplifier driving signal and in response thereto sensing and amplifying a signal of a bit line and a signal of a complementary bit line to which the sense amplifier is connected.

18. The semiconductor memory device operating method according to claim 17, wherein the outputting the sense amplifier driving signal outputs the sense amplifier driving signal with a larger driving capability during the part of the first predetermined time than a rest of the first predetermined time.

19. The semiconductor memory device operating method according to claim 17, wherein the first sense amplifier control signal includes a first PMOS sense amplifier control signal and a first NMOS sense amplifier control signal, the second sense amplifier control signal includes a second PMOS sense amplifier control signal and a second NMOS sense amplifier control signal, the sense amplifier driving signal includes a PMOS sense amplifier driving signal and an NMOS sense amplifier driving signal, and the sense amplifier driving signal driver includes a PMOS sense amplifier driving signal driver outputting the PMOS sense amplifier driving signal in response to the first and second PMOS sense amplifier control signals and an NMOS sense amplifier driving signal driver outputting the NMOS sense amplifier driving signal in response to the first and second NMOS sense amplifier control signals.

20. The semiconductor memory device operating method according to claim 17, wherein the command comprises an active command, read command, write command or precharge command.

* * * * *